INVENTOR.
JOSEPH T. MAUPIN
RICHARD J. ZELINKA
BY [signature]
ATTORNEY

June 2, 1959 J. T. MAUPIN ET AL 2,889,417

TETRODE TRANSISTOR BIAS CIRCUIT

Filed Jan. 26, 1956 2 Sheets-Sheet 2

INVENTOR.
JOSEPH T. MAUPIN
RICHARD J. ZELINKA

BY [signature]

ATTORNEY

United States Patent Office 2,889,417

Patented June 2, 1959

2,889,417

TETRODE TRANSISTOR BIAS CIRCUIT

Joseph T. Maupin, Deephaven, and Richard J. Zelinka, Lino Lakes, Minn., assignors to Minneapolis-Honeywell Regulator Company, Minneapolis, Minn., a corporation of Delaware Application January 26, 1956, Serial No. 561,550

4 Claims. (Cl. 179—171)

This invention relates to improvements in controlling transistor amplification characteristics in response to input signal conditions and is more specifically concerned with such control of a junction type tetrode transistor having two low resistance connections to the base area at points on opposite sides of the emitter junction.

An object of this invention is to provide in a junction type tetrode transistor means for improving the linearity of the dynamic amplification characteristics of the transistor.

A more specific object of this invention is to improve the linearity of the dynamic response of a junction type tetrode transistor by providing a transverse voltage gradient between two base electrodes of a tetrode transistor.

Figure 1:
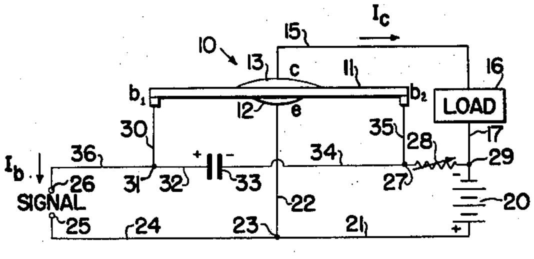
Figure 4:
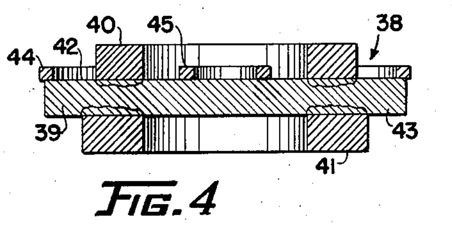
Figures 2, 3:
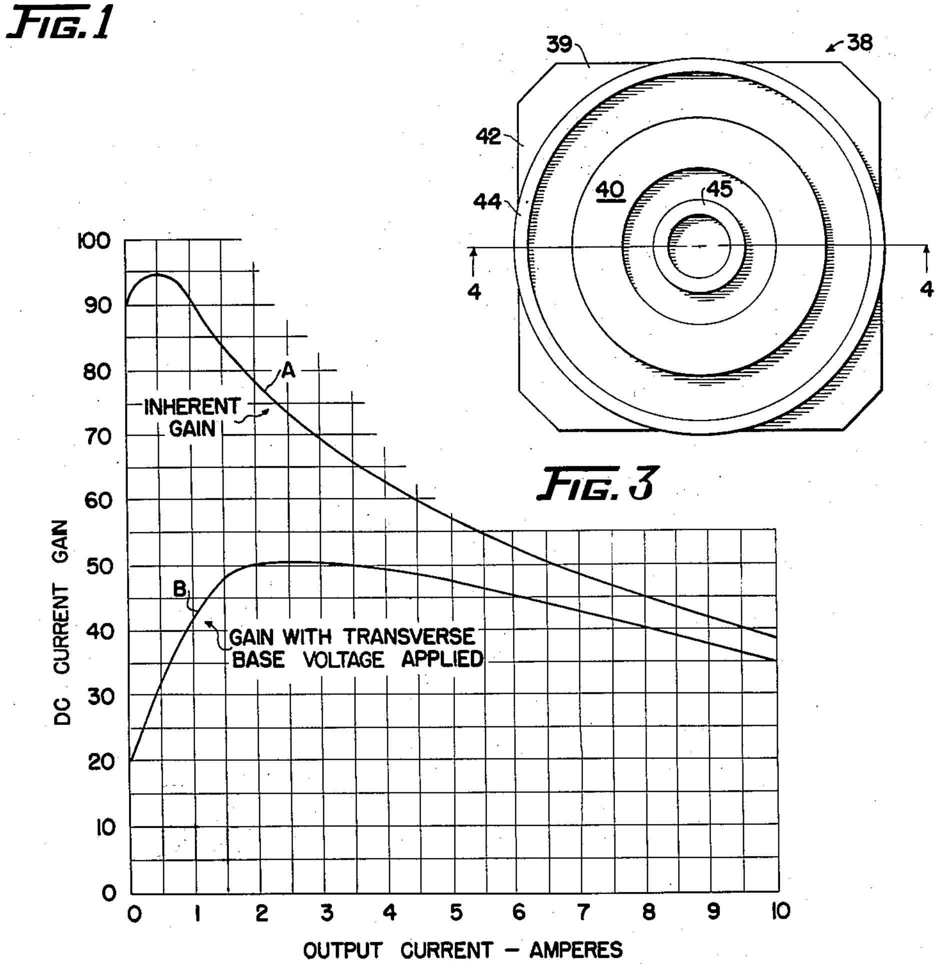

These and other objects of the invention will be understood upon consideration of the accompanying specification, claims, and drawings of which:

Figure 1 is a schematic representation of the circuitry of an embodiment of the invention, Figure 2 is a graphical representation of the transistor current gain characteristics under various conditions, and Figures 3 and 4 disclose the construction of a preferred type of transistor for use in this invention, Figure 3 being a top plan view of the device, and Figure 4 being a vertical sectional view taken along the lines and in the direction of the arrows 4—4 of Figure 3.

Referring now to Figure 1, there is disclosed a junction type tetrode transistor 10, which has been disclosed as a tetrode diffused junction type transistor, preferably of the type shown in copending application entitled "Semi-conductor Devices," Serial No. 556,210, filed December 29, 1955, and assigned to the same assignee as the present invention. Figures 3 and 4 disclose an embodiment of the transistor device of our copending application. As can be seen by reference to these figures the collector and emitter junctions 41 and 40 are annular in form and the base electrodes *b1* and *b2*, 44 and 45 are likewise annular, *b1* being located around the emitter annulus and base electrode *b2* being located within the circle of the emitter. It is to be understood, however, that any other suitable junction transistor may be used. The transistor 10 includes a wafer of semiconductive material 11 which has two low resistance base electrode connections *b1* and *b2* attached thereto. The transistor also has an emitter electrode 12 and a collector electrode 13. It will be noted that the base connections *b1* and *b2* are so positioned on the base 11 that the emitter and collector junctions are positioned between them. A resistive current path exists between the two base connections with the majority of the base resistance in the bridge area between the collector and the emitter junctions.

The collector 13 is electrically connected by a conductor 15 to one terminal of a suitable load device 16. A conductor 17 connects the other terminal of load device 16 to one terminal of a source of electrical energy 20, shown here as a battery. The other terminal of battery 20 is connected by conductors 21 and 22 to the emitter 12. A junction 23 connects conductors 21 and 22, and the junction is connected by a conductor 24 to an input terminal 25, which is one of a pair of input terminals 25 and 26. The input terminals are connected to a suitable source of signal input potential, not shown.

The base electrode *b1* is connected to the base electrode *b2* by an external circuit which includes a conductor 30, a junction 31, a conductor 32, a reactance 33 shown as a capacitor and conductors 34 and 35. The junction 31 is connected by a conductor 36 to the second input terminal 26. A junction 27 connects the conductors 34 and 35, and a variable resistor 28 is connected between the junction 27 and a junction 29 on conductor 17 located between the load device and battery 20.

Attention is now directed to Figures 3 and 4 wherein there is shown a modification of a device which is particularly applicable to the features of the present invention. Thus there is shown a transistor generally designated 38 which includes a semiconductor body 39 having a pair of junction electrodes 40 and 41 situated in oppositely disposed relationship on a pair of parallelly disposed surfaces 42 and 43, respectively. The emitter electrode 40 is situated between a pair of low resistance base electrodes 44 and 45 and is preferably somewhat smaller in width dimension than is the corresponding collector electrode 41. Details of this device are more clearly set forth in my copending application, above referenced. It has been found that good amplification, gain, and control characteristics are obtained when a device such as is shown in Figures 3 and 4 is utilized. It will be appreciated that transistor tetrode 10 may very well represent a partial view, i.e., the right or left half of transistor 38.

*Operation*

The circuit as shown in Figure 1 is preferably used as a class A amplifier for amplifying A.C. signals, although its use is not limited to such operation. This circuitry has for its specific purpose the improvement in dynamic linearization of transistor current amplification over the operating range of the transistor. Figure 1 shows a class A circuit where the D.C. bias from battery 20 is connected through resistor 28 to the base electrode *b2*. The A.C. signal source is directly connected between the base *b1* and the emitter 12. A relatively large capacitor 33 interconnects the base electrodes *b1* and *b2*. The operation of this circuit under no-signal quiescent conditions is that biasing current flows from the positive terminal of battery 20 through conductors 21 and 22 to the emitter 12, from the emitter to the semiconductive body 11, and out of base electrode *b2* and through resistor 28 back to the negative terminal of source 20. Due to the inherent resistance of the base 11 the current flowing out of base electrode *b2* develops a transverse voltage gradient across the base which causes the capacitor 33 to be charged with the indicated polarity, that is, the capacitor plate connected to base electrode *b2* being negative with respect to the opposite capacitor plate.

Referring now to Figure 2 curve A, as shown, is representative of the inherent common emitter current gain, or ratio of output D.C. collector current to input D.C. current, of a junction power transistor such as is disclosed in my copending application, previously referred to. It will be noted by reference to curve A that the inherent transistor current gain increases to a high peak value at a relatively low collector output current of about 0.5 ampere and then the gain continuously drops off as the output current increases. For certain applications, such a gain curve is desirable, however, for many applications a more nearly linear current-gain is required. One method of linearizing the gain characteristic is to apply a transverse voltage gradient across the base region between the base electrodes which results in a transverse current flowing between base electrodes *b*1 and *b*2. The resulting drift field established in the base region tends to cause the minority carriers injected by the emitter into the base region to be deflected laterally which decreases the number of minority carriers collected by the collector and thus reduces the transistor gain. In addition, the voltage gradient established in the base region causes the emitter-base junction to be back-biased except for a relatively small area adjacent the base electrode *b*2. The reduction of the effective emitter junction area results in a high emitter current density which lowers the efficiency of the emitter thereby reducing the transistor current gain. A given value of transverse bias voltage will be much more effective in reducing the current amplification at relatively low values of collector current. Referring to curve B of Figure 2 the flattening effect achieved with the transverse bias potential becomes apparent.

Referring again to Figure 1, the circuit is shown in the conventional common emitter configuration in which the emitter electrode is common to the input and output circuits. The circuit input terminals 25 and 26 are connected respectively to the emitter and base electrode *b*1. The collector and emitter electrodes 13 and 12 form the transistor output electrodes and are connected to the output circuit including load device 16 and battery 20. The capacitor 33 connected between the base electrodes *b*1 and *b*2 is made sufficiently large such that its charge and the transverse voltage, remains substantially unchanged as the input signal swings through its cycle. In this manner the input signal is applied substantially equally to the two base electrodes with respect to the emitter and the charge on the capacitor maintains a relatively constant voltage between the bases to linearize the current gain.

Figure 5:
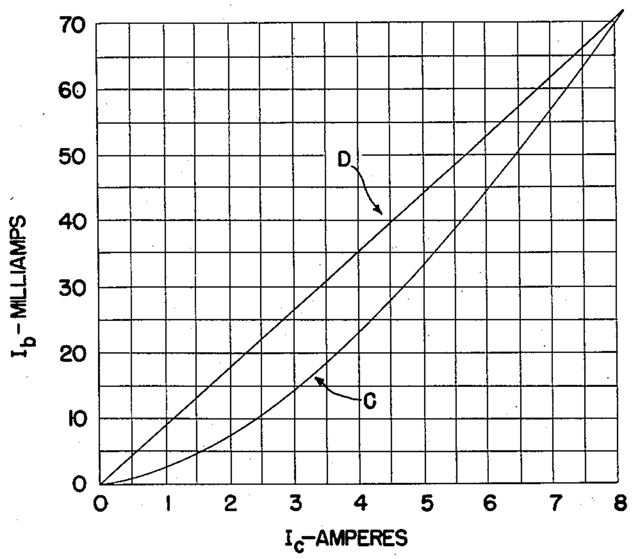

Although the nature of the improvement to be expected from the circuit of Figure 1 can be inferred from Figure 2, an oscillographic display of the dynamic current transfer characteristic ($I_B$ vs. $I_C$, with an A.C. input) shows directly the extent of the improvement in linearity compared with conventional triode operation. This is shown in Figure 5, which is a reproduction of two oscillographs; curve C is for conventional triode operation, while curve D depicts the response of the circuit of Figure 1. The improvement in linearity is apparent.

The circuit has been successfully operated under varied operating conditions, for example, in one case with a quiescent no-signal collector current of approximately 4 amperes and a variable magnitude input signal frequency of 100 c.p.s. The quiescent operating conditions may be varied by adjusting variable resistor 28 to control the bias current flowing from base electrode *b*2. Since the base electrode *b*1 is connected to an A.C. signal source substantially no D.C. bias current flows from this electrode.

As in conventional common emitter configurations this circuit is basically a current amplifier and provides an output current to energize load device 16 proportional to the signal current applied. Load device 16 may be any suitable type such as, for example, a relay, a resistive type load or the input circuit to a successive amplifier stage. Although capacitor 33 has been illustrated as a single capacitor it will be understood that variations are possible within the scope of the invention, for example, two series connected capacitors may interconnect the two base electrodes and the signal may be applied at the junction of the two capacitors. In certain cases it may be desirable to include a resistance in series with the capacitance.

In one successful embodiment of the invention, the following components were used:

| | |
|---|---|
| Resistor **28** ---------- | 250–1000 ohm variable. |
| Capacitor **33** -------- | 100 microfarads. |
| Battery **20** ---------- | 22½ volts. |
| Transistor **10** -------- | Minneapolis-Honeywell experimental power tetrode. |

Many changes in modifications of this invention will undoubtedly occur to those who are skilled in the art and we therefore wish it to be understood that we intend to be limited by the scope of the appended claims and not by the specific embodiment of our invention which is disclosed herein for the purpose of illustration only.

We claim:

1. Transistor amplifier apparatus for improving the linearity of the current amplification characteristic of a transistor comprising: a junction type tetrode transistor subject to a nonlinear current amplification characteristic having a semiconductive body of one conductivity type and including a plurality of electrodes comprising an emitter electrode, a collector electrode, and first and second base electrodes, said emitter and base electrodes having a substantially annular configuration with one base electrode being positioned on each side of said emitter electrode; capacitance means, said capacitance means being connected directly intermediate said first and second base electrodes; a single source of direct current energizing potential having a first and a second terminal; means directly connecting said emitter electrode to the first terminal of said potential source; output circuit means connecting the second terminal of said source to the collector electrode; impedance means independent of said output circuit means connected intermediate the second base electrode and the second terminal of said single potential source, said impedance means completing a direct current conductive loop through said semiconductive body to provide a voltage gradient across said semiconductive body, said voltage gradient causing said capacitive means to acquire a potential charge thereacross which charge remains substantially unchanged by input signals; said voltage gradient tending to modify and improve the linearity of the transistor current amplification characteristic; and circuit means connecting said base and emitter electrodes to a source of electrical input signal to control the output current of said transistor.

2. Transistor amplifying means comprising; a tetrode transistor amplifier having a semiconductive body of one conductivity type and including a collector electrode, and an emitter electrode in rectifying junction contact with said one conductivity type semiconductor body, and first and second base electrodes, said base electrodes being located on opposite sides of said emitter electrode, said base electrodes making ohmic contact with said body, said tetrode having an inherent nonlinear dynamic response to input signals; capacitor means, said capacitor means being directly connected between said first and second base electrodes; a single source of direct current potential having a first and a second terminal; means directly connecting the first terminal of said source to said emitter electrode; output circuit means comprising load means connecting the second terminal of said source to the collector electrode; impedance means independent of said output circuit means connected intermediate the second base electrode and the second terminal of said single potential source, said impedance means completing a direct current conductive loop from said potential source to provide a transverse current through said semiconductive body from said emitter electrode to said second base electrode; a source of alternating current signal; and means connecting said base and emitter electrodes to said signal source.

3. Apparatus for improving the linearity of the dynamic response of a transistor tetrode amplifier comprising; a junction tetrode transistor having a semiconductive body of one conductivity type and including a plurality of electrodes comprising a collector and an emitter electrode making rectifying junction contact with said semiconductive body and first and second base electrodes, said base electrodes being connected to said semiconductive body on opposite sides of said emitter electrode, said base electrodes making ohmic contact with said semiconductive body, a resistive path existing between said base electrodes through said body; capacitor means, said capacitor means directly interconnecting said first and second base electrodes; a single source of direct current energizing potential having a first and a second terminal; means directly connecting the first terminal of said source to said emitter electrode; output circuit means comprising load means connecting the second terminal of said source to the collector electrode; impedance means independent of said output circuit means connected intermediate the second base electrode and the second terminal of said single potential source, said impedance means completing a direct current conductive loop from said potential source to provide a transverse current through said semiconductive body from said emitter electrode to said second base electrode; whereby said dynamic response linearity is improved; and means connecting a source of alternating current signal to said base and emitter electrodes to control the output current supplied to said output means.

4. Transistor amplifier apparatus for linearizing the current amplification factor of a transistor comprising: a junction type tetrode transistor having a semiconductive body of one conductivity type and including a plurality of electrodes comprising an emitter electrode and a collector electrode making rectifying junction contact with said semiconductive body, and first and second base electrodes, said base electrodes making low resistance contact to said body; capacitance means, said capacitance means being directly connected between said first and second base electrodes; circuit means connecting said base and emitter electrodes to a source of electrical input signal current; a single source of direct current potential having a first and a second terminal; means directly connecting the first terminal of said source to said emitter electrode; output circuit means comprising load means connecting the second terminal of said source to the collector electrode; impedance means independent of said output circuit means connected intermediate the second base electrode and the second terminal of said potential source whereby a potential gradient is established in said semiconductive body between said emitter and said second base electrode and also between said first and second electrodes, said potential gradient across said semiconductive body causing a transverse current to flow through said body to said second base electrode, said potential gradient inducing a potential across said capacitance means whereby said potential gradient existing between said first and second base electrodes is maintained substantially unchanged in the presence of input signals, said potential gradient across said base tending to control and reduce the effective area of the emitter-base junction thereby tending to linearize the transistor current amplification factor.

References Cited in the file of this patent

UNITED STATES PATENTS

| | | |
|---|---|---|
| 2,655,610 | Ebers | Oct. 13, 1953 |
| 2,657,360 | Wallace | Oct. 27, 1953 |
| 2,672,528 | Shockley | Mar. 16, 1954 |
| 2,680,159 | Grover | June 1, 1954 |
| 2,695,930 | Wallace | Nov. 30, 1954 |
| 2,709,787 | Kircher | May 31, 1955 |

OTHER REFERENCES

Shea: "Transistor Circuits," first edition 1953, John Wiley & Sons (pp. 470–476, pertinent).